(12) United States Patent
Paul et al.

(10) Patent No.: US 11,067,656 B2
(45) Date of Patent: Jul. 20, 2021

(54) MRI DEVICE AND METHOD FOR OPERATING AN MRI DEVICE

(71) Applicant: Siemens Healthcare GmbH, Erlangen (DE)

(72) Inventors: Dominik Paul, Bubenreuth (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/782,326

(22) Filed: Feb. 5, 2020

(65) Prior Publication Data

US 2020/0249305 A1 Aug. 6, 2020

(30) Foreign Application Priority Data

Feb. 5, 2019 (EP) .................................... 19155540

(51) Int. Cl.
*G01R 33/565* (2006.01)
*G01R 33/483* (2006.01)
*G01R 33/56* (2006.01)

(52) U.S. Cl.
CPC ... *G01R 33/56545* (2013.01); *G01R 33/4835* (2013.01); *G01R 33/5608* (2013.01)

(58) Field of Classification Search
CPC .......... G01R 33/56545; G01R 33/4835; G01R 33/5608
See application file for complete search history.

(56) References Cited

U.S. PATENT DOCUMENTS

| | | | |
|---|---|---|---|
| 6,144,202 A * | 11/2000 | Kanazawa | G01R 33/4833 324/307 |
| 6,369,568 B1 | 4/2002 | Ma et al. | |
| 9,897,677 B2 | 2/2018 | Bhagat et al. | |
| 2007/0063704 A1 | 3/2007 | Peters | |
| 2009/0240379 A1 | 9/2009 | Feiweier | |
| 2018/0313927 A1 | 11/2018 | Zeller | |

FOREIGN PATENT DOCUMENTS

| | | |
|---|---|---|
| DE | 102008015261 B4 | 11/2009 |
| DE | 102017207128 A1 | 10/2018 |

OTHER PUBLICATIONS

European Search Report dated Aug. 13, 2019, for Application No. 19155540.8.

* cited by examiner

*Primary Examiner* — G. M. A Hyder
(74) *Attorney, Agent, or Firm* — Schiff Hardin LLP

(57) ABSTRACT

In a method for operating an MRI device, image data is acquired using a spin echo sequence with an additional readout per pulse train for acquiring correction data. By comparing subsequent correction data of later pulse trains to reference data acquired during a first pulse train of the sequence a difference indicating a parameter shift is determined. A corresponding compensation is then automatically determined in dependence on the difference and is applied to a set of predetermined parameters for at least a respective next pulse train and/or to the image data acquired in at least a respective next pulse train of the sequence.

20 Claims, 2 Drawing Sheets

MRI DEVICE AND METHOD FOR OPERATING AN MRI DEVICE

CROSS REFERENCE TO RELATED APPLICATIONS

This patent application claims priority to European Patent Application No. 19155540.8, filed Feb. 5, 2019, which is incorporated herein by reference in its entirety.

BACKGROUND

Field

The present disclosure relates to a method for operating a magnetic resonance imaging device or apparatus as well as to a magnetic resonance imaging device or apparatus adapted for the method. The disclosure further relates to a corresponding computer program product, and a corresponding computer-readable storage medium.

Related Art

Even though magnetic resonance imaging (MRI) is an established technique, there are still problems and challenges to overcome and development continues. One such challenge is that MRI devices or components thereof, such as gradient coils or gradient power amplifiers, can heat up significantly during operation. While there exist models and controlling strategies to prevent any actual overheating or damage to the components the change in temperature as well as other effects can cause a change or shift of operating characteristics or properties of the MRI device. Such a change or shift or drift during operation can in turn adversely affect image quality of resulting MR images. A change in temperature can, for instance, effect a change of the Larmor frequency and thus a mismatch between an intended and an actual slice position targeted by radio frequency pulses (RF pulses) for excitation. Also, a change of the Larmor frequency during or throughout a measurement can lead to a shift in a spatial position of a subject, that is, an object measured or imaged by means of a respective MRI device, as recorded during the measurement even if an actual position of the subject does not actually change. Also, a change in temperature can result in a change of eddy current effects which can for example lead to a shift in the k-space position of the recorded data.

The corresponding negative impacts on the image quality due to shifting, drifting or changing parameters, characteristics or properties of one or more components of the MRI device and/or other equipment used for the measurement have so far not been taken into account consistently, in particular for spin echo based MRI sequences.

An example for a method for correcting different errors in the context of magnetic resonance imaging is disclosed in U.S. Pat. No. 9,897,677 B2 specifically for wireless signal transmission. Disclosed therein are a method and an apparatus for correcting errors associated with asynchronous timing offsets between transmit and receive clocks in MRI wireless radiofrequency coils. The method includes receiving data of a plurality of signals including at least one projection echo. The method further includes identifying a plurality of offsets of the signals based on the at least one projection echo, and applying the plurality of offsets to a k-space of the plurality of signals.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
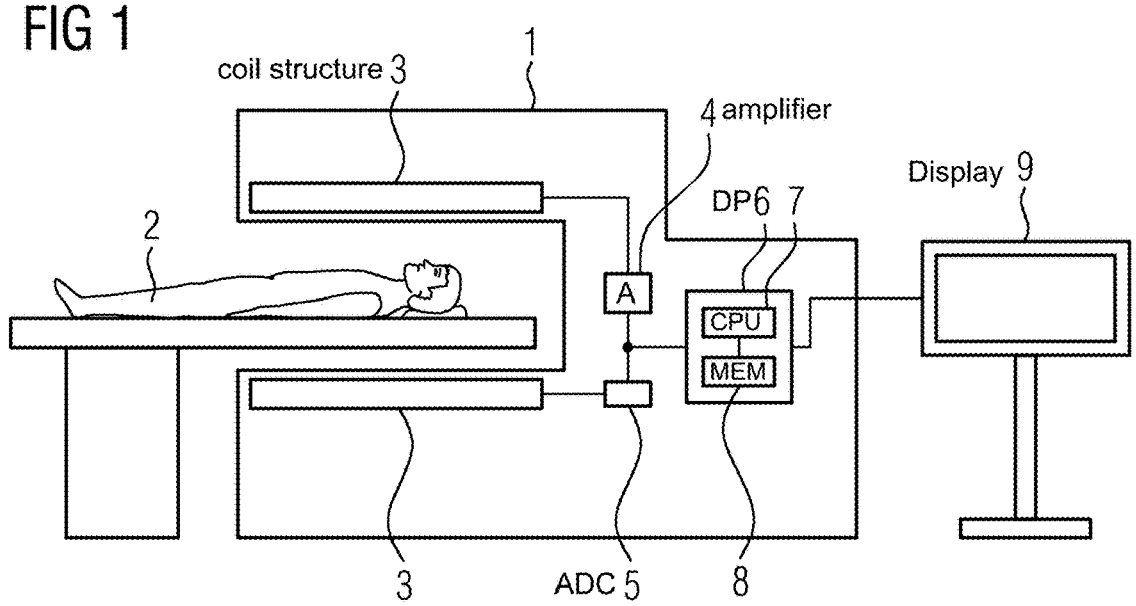
FIG. 1 illustrates a magnetic resonance imaging device according to an exemplary embodiment.
Figure 2:
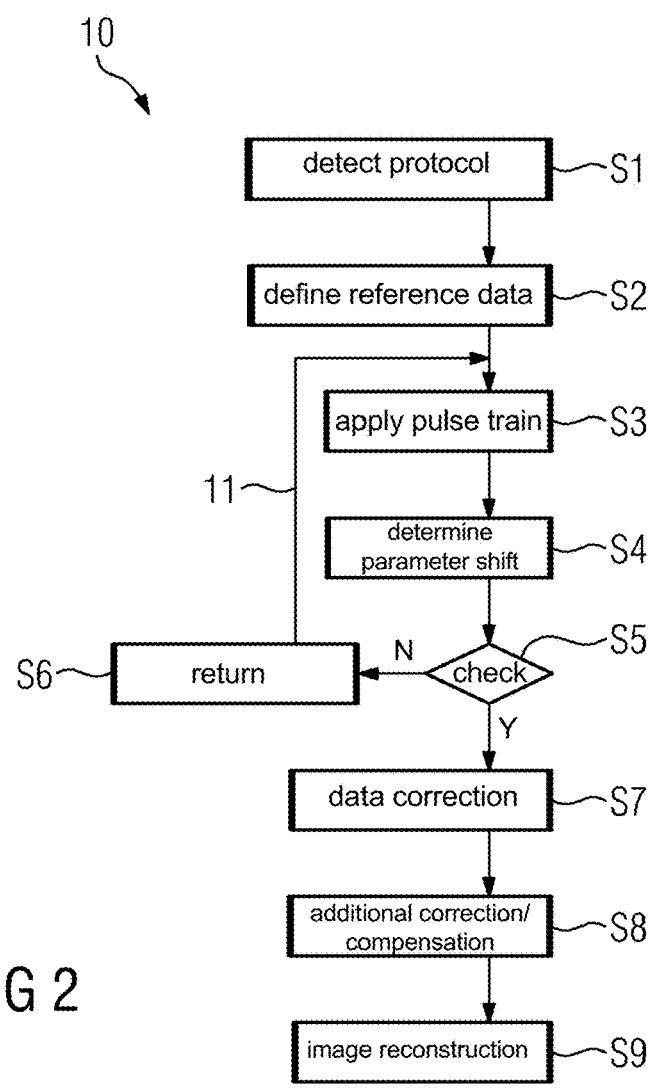
FIG. 2 is a flow chart of a method according to an exemplary embodiment, for operating the magnetic resonance imaging device of FIG. 1.
Figure 3:
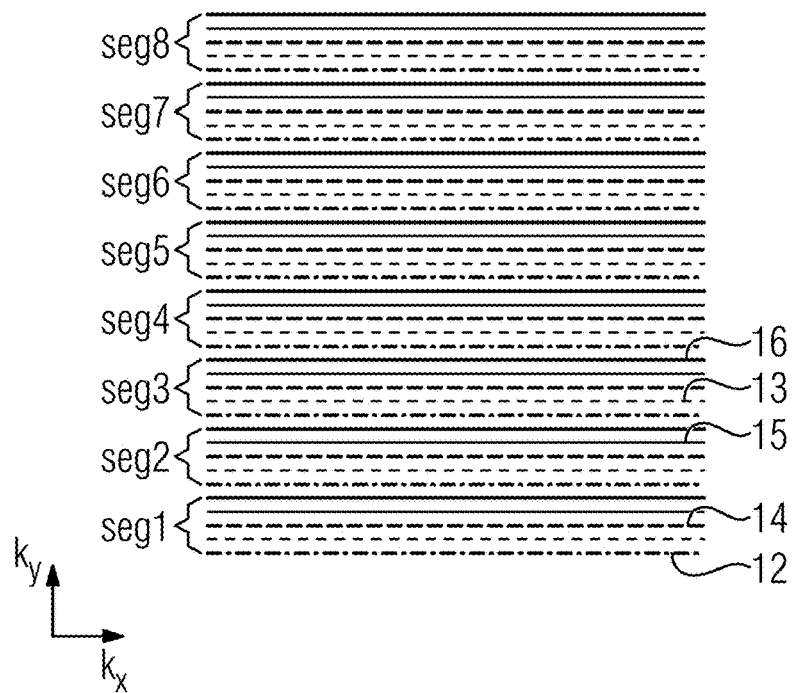
Figure 4:
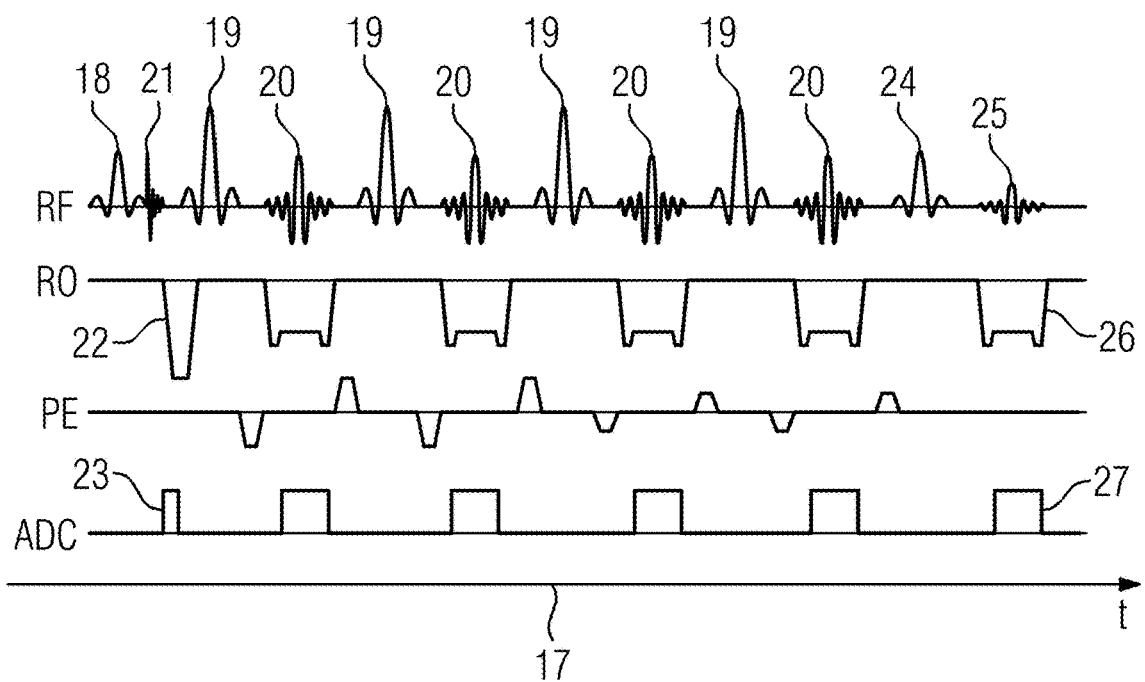

FIG. 3 schematically shows lines of k-space data divided into eight segments, according to an exemplary embodiment, acquired using the magnetic resonance imaging device of FIG. 1; and FIG. 4 illustrates graphs for different signals and component activity, according to an exemplary embodiment, occurring when applying the method of FIG. 2.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

An object of the present disclosure is to improve an image quality of MRI images based on spin echo sequences.

In an exemplary embodiment, the method for operating a magnetic resonance imaging device (MRI device) for imaging a subject using a spin echo based sequence includes multiple process steps. The subject can, for example, be a patient, a part of a patient, a tissue sample, or any other type of object or material that is accessible to magnetic resonance imaging techniques. In an exemplary embodiment, one process step of the method includes starting the sequence with a predetermined set of parameters. The sequence includes multiple successive pulse trains each including at least one excitation pulse followed by readouts of a respective echo train to acquire image data of or for the subject.

The set of parameters for the sequence can, for example, define acquisition parameters to be used for or in the sequence as well as any additional parameters or settings for the MRI device or its components. Specifically, the set of parameters or their values can, for example, define timings, flip angles, pulse heights, pulse lengths, one or more frequencies or tuning parameters for electric or electronic components of the MRI device, and/or the like. The excitation pulse can in particular be a radio frequency pulse used for exciting magnetic moments in the subject to be imaged.

The echo train can include one or more corresponding echoes, while the readouts in the sense of the present disclosure can in particular refer to applied readout gradients or gradient fields used for acquiring or measuring the echoes or corresponding image data.

The image data in this sense can, in particular, refer to, include or be derived from k-space data acquired or measured during the sequence. The image data can refer to measured or acquired data from which an image of the subject is—in particular directly—reconstructed. The image data in terms of the present disclosure can thus be seen as different from other data, such as motion correction data, which is only applied to other data, and from which the image of the subject is not directly reconstructed.

The sequence or its pulse trains can include other pulses, signals, and/or fields or gradients, such as refocusing pulses before each echo or readout, navigator data readouts for motion compensation, and/or the like.

Another process step of the method according to an exemplary embodiment takes place during the sequence and includes acquiring correction data in addition to the image data readouts. The correction data is acquired by means of at least one additional readout during at least a predetermined subset of multiple of the pulse trains. The respective readout for reading out or acquiring the correction data is thus another part of the sequence and the respective pulse train in addition to the readouts for acquiring the actual image data. The subset can, for example, include all of the pulse trains or only every n-th pulse train with n being a predetermined number. Acquiring the correction data in each pulse train can advantageously yield more data for a more accurate or reliably correction, while acquiring the correction data only in or from a smaller number of pulse trains can advantageously limit a corresponding acquisition and data handling effort.

In an exemplary embodiment, the correction data acquired during a first of the pulse trains of the subset of pulse trains is defined as reference data. In an exemplary embodiment, this first pulse train is the first pulse train of the subset or of the sequence. This does, however, not necessarily have to be the case, since in principle the method could work for any one of the pulse trains as the first pulse train if that particular pulse train is followed by one or more further pulse trains of the sequence and the subset. In this sense, the term or moniker "first" can be seen as a name for one of the pulse trains that is followed by one or more pulse trains. The correction data acquired after the first pulse train during subsequent pulse trains of the subset is then compared to the reference data to determine a difference between the different correction data indicating a parameter shift. Such a parameter shift or drift can, for example, be or include a shift or drift in a timing, a phase, a frequency, a signal slope, and/or the like.

In an exemplary embodiment, if such a difference or parameter shift between correction data and the reference data is detected for one of the subsequent pulse trains of the subset, that is, for one of the subsequently acquired correction data, then a compensation for the difference, that is, for the parameter shift, is automatically determined. Therein, the compensation is determined in dependence on the difference and is applied to the set of predetermined parameters for at least the respective next pulse train and/or to at least the image data acquired in the respective next pulse train, that is, the pulse train or pulse trains subsequent to the pulse train for which the difference is determined or detected.

The parameters can, in other words, automatically be adjusted during the sequence such that the adjusted parameters are used during remaining parts of the sequence or until again a difference is determined, indicating a further parameter shift. Alternatively or additionally, the compensation can be applied to the image data or processing data derived therefrom. The compensation can be applied echo train by echo train during or after complete acquisition of the entire set of image data needed for imaging the subject. Therefore, the present disclosure can provide an inter-echo train or inter-pulse train correction method.

Advantages of the present disclosure include enabling time efficient imaging of the subject and improving image quality due to correcting for effects that have previously not been taken into account and due to the granular per pulse train nature of the proposed correction method. Using the method according to the present disclosure can in the best case advantageously avoid that flawed image data that needs to later be corrected is acquired in the first place. This is the case because any detected parameter shift, that is, any change in an acquisition characteristic or performance of the magnetic resonance imaging device can be compensated for during the imaging process itself, that is, for the actual image data acquisition. It can thus be ensured that the acquired image data fits an intention of the initially set predetermined parameters. If, for example, during the imaging of the subject gradient heating takes place due to using or applying a majority of a specified power envelope or thermal design power of the MRI device, in particular of its gradient coil and/or gradient coil power amplifier, this can lead to a mismatch between phase encoding lines acquired at different time points during the sequence, that is, during imaging of the subject. Such a phase mismatch as well as gradient delays between echo trains that can also be caused by the heating can adversely affect image quality, for example by causing ghosting artefacts. These artefacts can be purely caused by a changing characteristic of the MRI device during operation even when the predetermined set of parameters is perfectly chosen for initial operating conditions and the subject does not move during imaging. Such a shift in operating characteristics can be observed or determined especially easily using correction data acquired by means of the additional readouts, since here no additional acquisition constraints, such as might be in place for acquiring the actual image data, need to be considered. Since the correction data can be independent of the image data or any imaging specifications or constraints set by medical personnel for the specific subject, it can always be acquired consistently so that the present disclosure can be applied universally.

In an exemplary embodiment, the compensation can, for example, be or include a correction factor for a frequency or a timing used in the sequence, that is, a corresponding MR imaging protocol, and/or a correction factor that can selectively be applied to the image data and/or data derived therefrom. The image data can be k-space data, which can, for example, be selectively shifted by adding on or multiplying with the correction factor, that is, the compensation. That the compensation can be applied to data derived from the image data means that before application of the compensation additional data processing steps might be applied to the image data, for example, as part of additional error correction methods. Also, the compensation might be applied to image space data derived from the image data by means of a Fourier transform.

It is an insight of the present disclosure that even when using a spin echo based sequence parameter shifts during imaging can lead to unwanted artefacts and therefore a corresponding compensation or correction can improve image quality of resulting MR images. This has previously not been taken into account since up until now spin echo based sequences usually only used a fraction of the available gradient power which led to the assumption that no adverse effects on the image quality were present or needed to be considered. Overall, the present disclosure can reduce artefacts and improve image quality, in particular when using gradient intense or highly gradient demanding spin echo based imaging sequences or imaging protocols. It is therefore an advantageous development of the present disclosure that as the sequence a turbo spin echo sequence is used. The term "turbo spin echo", also known as fast (turbo) spin echo can refer to implementations of the RARE technique (rapid acquisition with refocused echoes) in general.

In a further advantageous embodiment of the present disclosure, the set of parameters to which the compensation is applied includes a pulse characteristic of a respective excitation pulse and a readout frequency or tuning frequency of an analog-to-digital converter (ADC) used for the readouts. The compensation can, in other words change or adapt for example a timing, length, height, frequency, and/or phase of the excitation pulse used in the respective next pulse train as well as correspondingly adapt a setting of the ADC. Thereby, it can be ensured that during the respective next pulse train exactly an intended part or volume of the subject is excited and the image data is read out exactly for this part or volume. This takes into account that, for example due to heating during operation of the MRI device, in the middle of the sequence a different setting for a timing and/or a frequency might be needed than at the beginning of the sequence to excite a certain volume or readout image data for a certain volume of the subject as specified in the sequence or a corresponding protocol. This is particularly advantageous, since it can obviate a need for a later software based artefact correction, which can be less accurate. By adapting the pulse characteristic as well as the readout frequency of the ADC a mismatch can be avoided, further improving image quality of a resulting MR image.

In a further advantageous embodiment of the present disclosure, a respective free induction decay signal (FID signal) is acquired as the correction data. Using the FID signal as the correction data or as a basis for the correction data is useful because effects such as a change in temperature during operation of the MRI device can lead to a change of the Larmor frequency and the FID oscillates at the Larmor frequency. Therefore, by reading out or measuring the FID signal and comparing it to the reference data, that is, the FID signal acquired during the first pulse train, a change in operating characteristics or parameters of the MRI device can be detected. Additionally, the FID typically decays fast enough to not interfere with conventional sequences and can thus be read out without needing to significantly change existing sequences or protocols.

In a further advantageous embodiment of the present disclosure, a respective phase evolution throughout the FID signal is determined and a respective FID-specific phase factor is determined based thereon for each FID signal as a basis for the comparison. The above-mentioned correction frequency or correction factor for subsequent RF pulses and ADC-based readouts can then be determined to compensate any phase shift. It has been observed that MR images and their image quality can be highly sensitive towards phase changes or phase mismatches during imaging or in different parts of acquired image data from which the MR image is reconstructed. Also, effects that influence a phase of the FID signal typically can also influence phases of other signals such as the echoes read out for acquiring the actual image data. Since the phases of any other signals might be influenced by additional factors or might change intentionally during the imaging sequence, using the phase or phase evolution of the FID signals as a basis for the compensation can advantageously be achieved more easily and consistently than by trying to use the actual image data for correction. Overall, the phases or phase evolution of the FID signals therefore represent a reliable source for the correction data and the compensation.

In a further advantageous embodiment of the present disclosure, in each pulse train the respective FID signal is acquired directly after the respective excitation pulse of that pulse train. This ensures that the FID signal can consistently and reliably be acquired without any additional pulses and therefore without depositing any additional RF energy into the subject, which advantageously limits its exposure. Also, acquiring the FID signal at the same relative point of each pulse train ensures a consistent comparability. Additionally, acquiring the FID signal before the respective echo train, that is, at a beginning of the respective pulse train, provides ample time for performing the respective comparison with the reference data, and determining and applying the compensation as needed for the respective next pulse train. Thus, essentially no additional time might be needed for applying the present disclosure in existing imaging sequences or imaging protocols, which advantageously limits an influence on established workflows as well as stress or strain for the subject.

In a further advantageous embodiment of the present disclosure, an additional non-phase encoded k-space line is acquired as the correction data. Since the image data acquired by reading out the echoes of the echo trains can also be acquired in the form of k-space lines or k-space data, acquiring k-space data as the correction data can advantageously allow for especially easy and accurate determining and applying of the compensation. Since the phase encoding is reverted after each echo, the correction data, which can also be classified as navigator data, can in principle be acquired at any position in the respective pulse train, which advantageously allows for flexible adaptation and application of the present disclosure to existing protocols and workflows. From the correction data a time shift and/or a phase drift can be determined as the difference to the reference data. Therefrom, a slope of the determined time shift and/or phase drift values can be determined. To compensate for the difference as an example a corresponding linear ramp with the determined slope can then be applied to the acquired image data. If correction data from multiple pulse trains is already available, one method to determine an echo shift is to fit the phase shift or phase evolution over an imaged volume after Fourier transforming the image data, that is, a raw data set acquired during imaging. A method to determine an object shift on the other hand is to perform a spatial registration in image space.

In a further advantageous embodiment of the present disclosure, the additional non-phase encoded k-space line is acquired at the end of each pulse train of the subset. This has the advantage that it makes adapting existing sequences particularly easy since it does not require any consideration of timings or influences during the echo train preceding the acquisition of the additional non-phase encoded k-space line. Also, acquiring this correction data at the end of each pulse train avoids any interference with the echoes of the respective echo train and thus minimises a risk for introducing additional disturbances which could potentially lead to additional artefacts if the sequence is not adapted properly. Thus, by mandating that the correction data is acquired at the end of each pulse train, an optimised image quality can be achieved most reliably, since a risk for user error can be minimised.

In a further advantageous embodiment of the present disclosure, the additional non-phase encoded k-space line is acquired in the middle or essentially in the middle of each pulse train of the subset thereby sampling a central k-space position over time. Since the additional non-phase encoded k-space line is acquired multiple times—preferably in each pulse train—the central k-space position or central k-space line is sampled at multiple different points in time during imaging of the subject. Then, after the imaging of the subject is complete, that is, after the sequence is completed, the additional k-space lines, that is, the potentially different values of or for the central k-space position—also known as a $k_0$-zero-position or $K_0$-line—can be combined to form a basis for further improvements to the image quality of the resulting MR image. Acquiring the additional k-space lines at least essentially in the middle of each pulse train can enable this additional correction or image quality improvement especially easily and reliably.

In a further advantageous embodiment of the present disclosure, a noise reduction for a reconstruction of a final image, that is, a resulting MR image of the subject is performed based on an average of acquired values of the central k-space position sampled in each of the pulse trains of the subset by means of the acquired additional non-phase encoded k-space lines. In other words, in addition to the compensation for the parameter shift the correction data can be used in a final image reconstruction dataset to improve a signal-to-noise ratio (SNR). This can make the proposed method very efficient in achieving an improved image quality.

In a further advantageous embodiment of the present disclosure, as part of each pulse train of the subset a correction refocusing pulse is used or applied before the respective acquisition of the additional non-phase encoded k-space line. Therein, the correction refocusing pulse is weaker than at least one refocusing pulse, preferably weaker than any refocusing pulses, used in the respective pulse train before each echo of the respective echo train for image data acquisition. The correction refocusing pulse being weaker can mean that it has a smaller amplitude or peak value, is shorter, induces a smaller flip angle, induces the flip angle less completely throughout the subject or excited volume, and/or the like. In particular, the correction refocusing pulse being weaker means that it deposits less RF energy than the other, regular refocusing pulses for image data acquisition into the subject. This is an advantage since it means less stress or strain for the subject and more flexibility for designing the sequence, since the weaker correction refocusing pulse uses up less of an energy deposition budget than a correction refocusing pulse of equal strength to the other, regular refocusing pulses of the sequence. The weaker correction refocusing pulse could potentially lead to disadvantages such as a reduced contrast ratio, if a following echo were read out and used as image data instead of being used just as correction data correction or for compensation purposes. However, since no image part of the final MR image is directly reconstructed from the correction data read out after the correction refocusing pulse, in practice this potential disadvantage is of no consequence and the proposed method represents an overall optimisation in terms of time, energy, efficiency, and strain on the used MRI device and on the subject.

In a further advantages embodiment of the present disclosure, an addition gradient echo is read out to acquire the correction data. In an exemplary embodiment, this additional gradient echo is read out after a last regular spin echo read out as image data. To create or generate the additional gradient echo, a corresponding additional gradient pulse can be applied in at least the subset of pulse trains, that is, in each or at least one pulse train in which correction data is acquired. The additional gradient pulse can have an amplitude opposite to the amplitude of a last gradient pulse used for generating image data. This development of the present disclosure can also advantageously limit a strain or stress or exposure of the imaged subject.

In a further advantageous embodiment of the present disclosure, if multiple slices of the subject are imaged, the correction data is averaged for the imaged slices and the average is used for compensation in subsequent slices. In particular, an averaging of determined phase evolutions and/or signal offsets over the slices, that is, a slice stack, can be performed to increase stability of the method, that is, of the compensation.

In a similar approach, the averaging can be performed using a sliding window approach over a time dimension. This means that a sliding time window of a predetermined length that continually moves with acquisition of new data over time is used to define or determine data from which a continually updated average is calculated. This can advantageously limit an influence of spike events or purposeful changes over time on data with different but correct values. Therein, the correction data used for averaging can be taken from each pulse train in which correction data is acquired or from a predetermined subset thereof. Taking only a subset of the correction data can advantageously limit a computational effort and does not necessarily lead to a significantly reduced image quality, since the parameter shift or drift can typically happen gradually and without sharp jumps that would require a faster or more detailed sample rate to factor in.

Another aspect of the present disclosure is a magnetic resonance imaging device (MRI device) having data acquisition means (i.e. scanner) for acquiring image data of a subject and of corresponding correction data, and having data processor adapted to execute the process steps of a method according to the present disclosure. In particular, the MRI device according to the present disclosure can be the MRI device mentioned in conjunction with the method according to the present disclosure. The data acquisition means can include electrical and magnetic means, such as a signal generator, an amplifier, a coil structure including multiple coils for generating and/or detecting magnetic fields and/or other electromagnetic signals, a corresponding electrical infrastructure, and/or the like. The data acquisition means can also include a data interface of the data processor connected to the mentioned electrical and/or magnetic components via a data connection. The data processor can in particular be connected to the data acquisition means such that any data acquired by the data acquisition means can be provided as input to the data processor. The data processor can include a data store and a processor connected thereto, wherein the processor can include a microchip, microprocessor, microcontroller, and/or a dedicated hardware circuitry. The data processor, in particular, the data store, can store the acquired data to be processed, that is, the acquired image data and correction data, as well as any processing results, such as the above-mentioned correction factor and a final reconstructed MR image of the subject. The data processor can also include an output interface for providing the acquired data and/or any intermediate or final processing results as an output, for example to a display unit or to a further processor, such as an image processing algorithm or image processing device.

Another aspect of the present disclosure is a computer program product, that is, a program code, including instructions to cause a magnetic resonance imaging device according to the present disclosure to execute the steps of the method according to the present disclosure. In particular, the computer program product can be adapted to be executed by the data processor of the magnetic resonance imaging device according to the present disclosure, in particular its processor. The computer program product according to the present disclosure does, in other words, represent or encode the process steps of the method according to the present disclosure.

Another aspect of the present disclosure is a computer-readable storage medium having stored thereon a computer program product according to the present disclosure.

To enable the magnetic resonance imaging device according to the present disclosure to execute the method according to the present disclosure, the MRI device, in particular its data processor, can include a computer-readable storage medium according to the present disclosure.

The embodiments and developments of the present disclosure described herein for at least one aspect of the present disclosure, that is, at least for one of the method, the magnetic resonance imaging device, the computer program product, and the computer-readable storage medium, as well as the corresponding advantages may be applied to any and all aspects of the present disclosure.

FIG. 1 schematically illustrates a magnetic resonance imaging (MRI) device 1 for imaging a subject which here is depicted as a patient 2. In an exemplary embodiment, the MRI device 1 includes an internal coil structure 3, which can include multiple coils or coil arrangements, such as $B_0$-field coil, gradient coils, and an RF coil. Further, the MRI device 1 includes an electric amplifier 4. The amplifier 4 can include multiple components or parts, in particular a gradient coil power amplifier (GCRP). The amplifier 4 and the coil structure 3 can generate fields and pulses penetrating a volume which is occupied by the patient 2 according to well-known magnetic resonance imaging methods and techniques. The MRI device 1 further includes a readout structure for acquiring or measuring data in response to the fields and pulses generated by the amplifier 4 and the structure 3. Presently, the readout structure is schematically represented by an analogue-to-digital converter—or ADC 5 for short.

In an exemplary embodiment, the MRI device 1 also includes a data processor 6, which in turn includes a processor 7 and a storage medium (e.g. memory) 8 connected thereto. The data processor 6 can have multiple interfaces, for example for communicating with the amplifier 4 and the ADC 5 as well as a display unit 9, which is also schematically depicted here connected to the data processor 6. The display unit 9 may be part of the MRI device 1 or connected thereto.

The data processor 6 can function as a controller controlling operation of the MRI device 1. For this purpose, the storage medium 8 can contain program code, including an operating system or operating instructions, which can be executed by the processor 7 to operate the MRI device 1. In an exemplary embodiment, the data processor 6 (including one or more of its components) includes processor circuitry that is configured to perform one or more functions and/or operations of the data processor 6 (and/or one or more functions and/or operation of one or more of its components).

FIG. 2 schematically shows an exemplary flow chart 10, illustrating a method according to an exemplary embodiment, in which the MRI device 1 can operate or be operated. In an exemplary embodiment, the flowchart 10 represent parts, modules, or instructions of the computer program stored on the storage medium 8. The flow chart 10 is just an example and its parts or process steps can also be implemented or executed in other ways or orders.

In a process step S1 a selection of a predetermined protocol for imaging the patient 2 is detected and a predetermined turbo spin echo sequence, including multiple successive pulse trains as specified by the protocol, is started. During a first one of these multiple pulse trains a first set of image data as well as corresponding correction data is acquired.

In a process step S2 the correction data acquired during the first pulse train is defined as reference data.

In a process step S3 a next pulse train is applied to acquire a next set of image data and correction data.

In a process step S4 the latest correction data acquired in the process step S3 is compared to the reference data to determine a difference indicating a parameter shift, that is, a change in operating conditions or operating characteristics of the MRI device 1, in particular the coil structure 3, the amplifier 4, and the ADC 5. Such a difference may, for example, be caused by temperature changes in one or more components of the MR device 1 during its operation. If it is determined that there is indeed such a difference between the correction data of the second—or in general the last executed—pulse train and the reference data, then a correction or compensation factor is automatically determined. For this purpose, the storage medium 8 can contain a model of the MRI device 1 and/or one or more components thereof, such as the coil structure 3, the amplifier 4, and/or the ADC 5. The model can describe a temperature-dependent behaviour of the MRI device 1 or its components. The model can thus be used to determine a correction factor or compensation, such as a correction frequency, that can be applied to an initial or current set of operating parameters according to which the MRI device 1 and its individual components are operating. The correction or compensation can take into account a different response or behaviour of the MRI device 1 or one or more of its components depending on one or more conditions, influences or parameters, such as the above-mentioned temperature. The correction or compensation is determined such that by applying it a change or shift in the response or behaviour of the MRI device 1 or its components can be compensated. This way the MRI device 1 by using the initial or current set of operating parameters modified by the correction of compensation does again operate as specified by the protocol or sequence, i.e. excites a specified volume of the patient 2 and performs a readout for exactly that specified volume.

In a process step S5 it is checked if the predetermined sequence for imaging the patient 2 has been completed, that is, if all of the image data needed for reconstruction an image of the patient 2 has been acquired. If this is not the case, meaning that still more pulse trains and corresponding readouts are to be performed, then the correction or compensation determined in process step S4 is applied to the current set of operating parameters of the MRI device 1. As schematically indicated by a program path 11, a next iteration S6 of the process steps S3, S4, and S5 is then executed. Therein, the respective next pulse train and the corresponding readout of image data and correction data is performed using the modified set of operating parameters. This loop is executed until the sequence is completed.

After the sequence is completed, the method or program jumps to a process step S7, wherein an additional data correction step or sub-process can be executed. This can, for example, include fitting a phase evolution over the imaged volume to determine an echo shift. Such an echo shift can manifest itself as phase jumps between pixels of an image reconstructed from the image data previously acquired during the sequence. Acquiring the image data as k-space data and reconstructing an image therefrom by means of a Fourier transform technique can be done using methods well-known in the field of magnetic resonance imaging. To correct or avoid any artefacts caused by remaining shifts or drifts in signal timing or phase the additional correction or compensation in process step S7 can, for example, include application of a linear phase ramp with the slope of the determined phase shift to the acquired image data.

In a process step S8 an additional correction or compensation can be performed to further improve image quality of an MR image of the patient 2, which is to be reconstructed from the acquired image data, by improving a signal-to-noise ratio (SNR). This can be done by averaging and/or otherwise statistically evaluating the correction data acquired during the different pulse trains of the sequence and using a corresponding averaged signal or value for a final image reconstruction of the MR image of the patient 2. Similarly, a signal or value best fitting to the rest of the k-space data in terms of signals shifts or drifts can be used. For example, if there is a linear drift over time, those central k-space line can be used that have acquisition times or timestamps that are closest in time to the acquisition times or timestamps of respective neighbouring k-space lines. The final image reconstruction is then performed in a process step S9. The final reconstructed MR image 2 can then, for example, be displayed on the display unit 9.

FIG. 3 schematically shows a set of k-space data acquired as the image data during the sequence. Different dimensions of the k-space are indicated by a coordinate system with coordinate axes $k_x$ and $k_y$. The set of k-space data presently includes eight segments—seg1 to seg8—with each segment including five phase encoding lines. For each of the segments seg1 to seg8 these five phase encoding lines are a respective first phase encoding 12, a respective second phase encoding line 13, a respective third phase encoding line 14, a respective fourth phase encoding line 15, and a respective fifth phase encoding line 16. Correspondingly five different phase encoding lines are also present in each of the other segments seg2 to seg8. The complete set of k-space data is thus made up of five sets of eight phase encoding lines equally divided into the eight segments. For example, one such set of the phase encoding lines includes the eight first phase encoding lines 12, a second set of phase encoding lines includes the eight second phase encoding lines 13, and so forth. Each set of eight phase encoding or k-space lines is acquired in one respective pulse train. To improve readability only one of each type of phase encoding line is indicated here.

If inter-echo train differences, that is, differences in terms of a global phase and/or gradient delay offset between different pulse trains, occur due to effects or influences—such as gradient heating—ghosting patterns can appear in a resulting MR image. These ghosting patterns or artefacts due to mismatch of phase images for the different sets of phase encoding lines can be avoided and/or corrected using the method illustrated by the flow chart 10 as described herein.

FIG. 4 schematically illustrates multiple graphs for different signals and component activities occurring as part of the described method. These different signals or component activities are outlined along a time axis 17. A first line or row indicated as RF shows radio-frequency signals of one pulse train of a turbo spin echo sequence. The pulse train includes an initial excitation pulse 18 followed by multiple regular refocusing pulses 19. After each refocusing pulse 19 an echo 20 occurs and is read out by applying a readout gradient RO and converting a detected signal using the ADC 5. The echoes 20 form a so-called echo train and represent the above-mentioned image data from which the image of the patient 2 can be directly reconstructed. A second line or row indicated as RO shows a signal or activity of a readout gradient synced up with the echoes 20. Below that in a third line or row indicated as PE a signal or activity of a phase encoding gradient is shown. In a fourth line or row indicated as ADC an activity of the ADC 5 also synced up with the echoes 20 is shown.

While the excitation pulse 18, the refocusing pulses 19, and the echoes 20 can be part of conventional sequences, FIG. 4 shows additional features that are part of the presently described method. First of all, indicated directly after the excitation pulse 18, an FID echo or FID signal 21 is shown, which is read out as the above-mentioned correction data in the process steps S1 and S3. The readout of the FID signal is indicated or illustrated by corresponding readout activity 23 of the ADC 5. Noticeably, a prephaser gradient 22 for following readout gradient activity that follows the refocusing pulses 19 only starts after the FID signal 21 and the corresponding ADC readout activity 23. Furthermore, after a last of the echoes 20 an additional non-phase encoded k-space line is read out also as part of the above-mentioned correction data. For this purpose, an additional correction refocusing pulse 24 is applied and a following correction echo 25 is then read out as indicated by corresponding additional readout activity 26 of the readout gradient and corresponding additional ADC activity 27.

Noticeably, the correction refocusing pulse, 24 is smaller or weaker than the regular refocusing pulses 19 to limit the deposition of RF energy into the patient 2. Also, the correction echo 25 is non-phase encoded as is apparent by the lack of corresponding activity of the phase encoding gradient PE during or right before the correction echo 25.

FIG. 4 indicates just one of the above-mentioned pulse trains and corresponding activity so that as part of the complete sequence these signals and activities can be repeated multiple times.

By employing the indicated modifications 21 to 27 to a conventional turbo spin sequence an inter-echo train correction can be performed, since the acquired additional correction data or navigator data can be used to reduce artefacts and improve image quality, in particular for highly gradient demanding turbo spin echo imaging protocols.

Any connection or coupling between functional blocks, devices, components of physical or functional units shown in the drawings and described hereinafter may be implemented by an indirect connection or coupling. A coupling between components may be established over a wired or wireless connection. Functional blocks may be implemented in hardware, software, firmware, or a combination thereof.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for operating a magnetic resonance imaging device for imaging a subject using a spin echo based sequence, the method comprising:
    starting the sequence with a predetermined set of parameters, wherein the sequence includes multiple successive pulse trains each including at least one excitation pulse followed by readouts of a respective echo train to acquire image data for the subject;
    during the sequence, acquiring: correction data using at least one additional readout during at least a predetermined subset of multiple of the pulse trains;
    defining the correction data acquired during a first pulse train of the subset of pulse trains as reference data;
    comparing the correction data acquired during subsequent pulse trains of the subset of pulse trains after the first pulse train to the reference data to determine a difference indicating a parameter shift; and
    in response to the difference being detected for one of the subsequent pulse trains of the subset: automatically determining a compensation for the difference based on the difference, and applying the determined compensation to the set of predetermined parameters for at least the respective next pulse train and/or to the image data acquired in at least the respective next pulse train.

2. The method according to claim 1, wherein the sequence is a turbo spin echo sequence.

3. The method according to claim 1, wherein the set of parameters to which the compensation is applied includes a pulse characteristic of a respective excitation pulse and a readout frequency of an analog-to-digital converter of the imaging device used for the readouts.

4. The method according to claim 1, wherein a respective free induction decay signal is acquired as the correction data.

5. The method according to claim 4, wherein, throughout the free induction decay signals, their phase evolution is determined and a respective free induction decay (FID)-specific phase factor is determined based thereon for each FID signal as a basis for the comparison.

6. The method according to claim 5, wherein, in each pulse train of the subset, the respective free induction decay signal is acquired directly after the respective excitation pulse of that pulse train.

7. The method according to claim 1, wherein an additional non-phase encoded k-space line is acquired as the correction data.

8. The method according to claim 7, wherein the additional non-phase encoded k-space line is acquired at an end of each pulse train of the subset.

9. The method according to claim 7, wherein the additional non-phase encoded k-space line is acquired in a middle of each pulse train of the subset to sample a central k-space position.

10. The method according to claim 9, wherein performing a noise reduction, based on an average of acquired values of the central k-space position sampled in each of the pulse trains of the subset using the acquired additional non-phase encoded k-space lines, to reconstruct a final image of the subject.

11. The method according to claim 7, wherein, as part of each pulse train of the subset, a correction refocusing pulse is applied before the respective acquisition of the additional non-phase encoded k-space line, the correction refocusing pulse being weaker than at least one refocusing pulse used in the respective pulse train before each echo of the respective echo train for image data acquisition.

12. The method according to claim 1, wherein if multiple slices of the subject are imaged, the correction data is averaged for the imaged slices and the average is used for compensation in subsequent slices.

13. A non-transitory computer-readable storage medium with an executable program stored thereon, that when executed, instructs a processor to perform the method of claim 1.

14. A computer program product having a computer program which is directly loadable into a memory of a controller of the magnetic resonance imaging device, when executed by the controller, causes the magnetic resonance imaging device to perform the method as claimed in claim 1.

15. A magnetic resonance imaging (MRI) device, comprising:
a data acquisition scanner configured to acquire image data of a subject and to acquire corresponding correction data; and
a data processor configured to:
control the data acquisition scanner to start a sequence with a predetermined set of parameters, wherein the sequence includes multiple successive pulse trains each including at least one excitation pulse followed by readouts of a respective echo train to acquire the image data for the subject;
during the sequence, acquire the correction data using at least one additional readout during at least a predetermined subset of multiple of the pulse trains;
define the correction data acquired during a first pulse train of the subset of pulse trains as reference data;
compare the correction data acquired during subsequent pulse trains of the subset of pulse trains after the first pulse train to the reference data to determine a difference indicating a parameter shift; and
in response to the difference being detected for one of the subsequent pulse trains of the subset: automatically determine a compensation for the difference based on the difference, and apply the determined compensation to the set of predetermined parameters for at least the respective next pulse train and/or to the image data acquired in at least the respective next pulse train.

16. The device according to claim 15, wherein the set of parameters to which the compensation is applied includes a pulse characteristic of a respective excitation pulse and a readout frequency of an analog-to-digital converter of the device used for the readouts.

17. The device according to claim 15, wherein a respective free induction decay signal is acquired as the correction data.

18. The device according to claim 17, wherein, throughout the free induction decay signals, their phase evolution is determined and a respective free induction decay (FID)-specific phase factor is determined based thereon for each FID signal as a basis for the comparison.

19. The device according to claim 18, wherein, in each pulse train of the subset, the respective free induction decay signal is acquired directly after the respective excitation pulse of that pulse train.

20. The device according to claim 15, wherein an additional non-phase encoded k-space line is acquired as the correction data.

* * * * *